United States Patent
Agamy et al.

(10) Patent No.: US 9,103,865 B2
(45) Date of Patent: Aug. 11, 2015

(54) METHODS FOR LOCATING GROUND FAULTS AND INSULATION DEGRADATION CONDITION IN ENERGY CONVERSION SYSTEMS

(71) Applicant: GENERAL ELECTRIC COMPANY, Schenectady, NY (US)

(72) Inventors: Mohamed Agamy, Niskayuna, NY (US); Ahmed Elasser, Niskayuna, NY (US); Anthony William Galbraith, Salem, VA (US); Maja Harfman Todorovic, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 320 days.

(21) Appl. No.: 13/726,730

(22) Filed: Dec. 26, 2012

(65) Prior Publication Data
US 2014/0176151 A1    Jun. 26, 2014

(51) Int. Cl.
| | |
|---|---|
| G01R 31/00 | (2006.01) |
| G01R 31/02 | (2006.01) |
| H02H 3/33 | (2006.01) |
| H02H 3/46 | (2006.01) |
| H02S 50/10 | (2014.01) |
| G01R 31/12 | (2006.01) |
| H02H 7/20 | (2006.01) |
| G01R 31/40 | (2014.01) |

(52) U.S. Cl.
CPC .......... *G01R 31/025* (2013.01); *G01R 31/1272* (2013.01); *H02H 3/33* (2013.01); *H02H 3/46* (2013.01); *H02S 50/10* (2014.12); *H02H 7/20* (2013.01); *H02S 50/00* (2013.01); *Y02E 10/56* (2013.01)

(58) Field of Classification Search
None
See application file for complete search history.

(56) References Cited

U.S. PATENT DOCUMENTS

| | | | | |
|---|---|---|---|---|
| 6,593,520 | B2 * | 7/2003 | Kondo et al. | 136/244 |
| 7,751,993 | B2 * | 7/2010 | Mirafzal | 702/58 |
| 7,764,067 | B2 * | 7/2010 | Lindsey | 324/519 |
| 2002/0105765 | A1 * | 8/2002 | Kondo et al. | 361/42 |
| 2006/0237058 | A1 | 10/2006 | McClintock et al. | |
| 2009/0284998 | A1 * | 11/2009 | Zhang et al. | 363/55 |

(Continued)

FOREIGN PATENT DOCUMENTS

| | | |
|---|---|---|
| EP | 1143594 A2 | 10/2001 |
| WO | 2012100263 A2 | 7/2012 |

OTHER PUBLICATIONS

EP Search Report and Written Opinion issued May 14, 2014 in connection with corresponding EP Patent Application No. 13188933.9.

*Primary Examiner* — Jeff Natalini
(74) *Attorney, Agent, or Firm* — Nitin N. Joshi

(57) ABSTRACT

Methods for determining a ground fault or insulation degradation condition within energy conversion systems are described. A method for determining a ground fault within an energy conversion system may include, in part, a comparison of baseline waveform of differential current to a waveform of differential current during operation for a plurality of DC current carrying conductors in an energy conversion system. A method for determining insulation degradation within an energy conversion system may include, in part, a comparison of baseline frequency spectra of differential current to a frequency spectra of differential current transient at start-up for a plurality of DC current carrying conductors in an energy conversion system. In one embodiment, the energy conversion system may be a photovoltaic system.

18 Claims, 15 Drawing Sheets

(56) References Cited

U.S. PATENT DOCUMENTS

Figure 1:
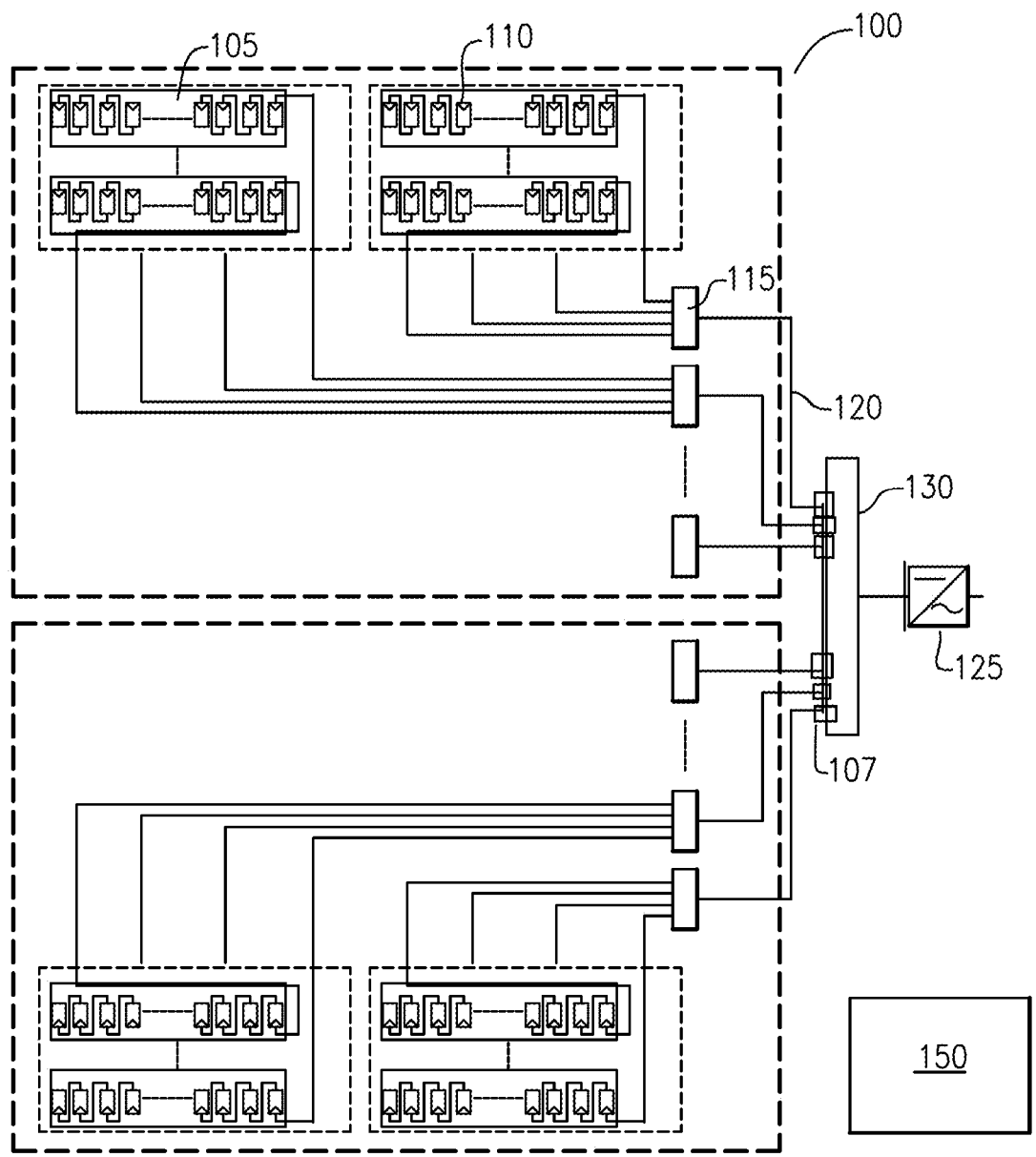

| | | |
|---|---|---|
| 2010/0106339 A1 | 4/2010 | Little et al. |
| 2011/0090607 A1 | 4/2011 | Luebke et al. |
| 2011/0141644 A1 | 6/2011 | Hastings et al. |
| 2011/0301772 A1 | 12/2011 | Zuercher et al. |
| 2012/0048326 A1 | 3/2012 | Matsuo et al. |
| 2012/0049879 A1 | 3/2012 | Crites |
| 2012/0053867 A1 | 3/2012 | Dunn et al. |
| 2012/0113554 A1* | 5/2012 | Paoletti et al. ............ 361/63 |
| 2012/0174961 A1 | 7/2012 | Larson et al. |
| 2012/0256584 A1 | 10/2012 | Crites |

\* cited by examiner

METHODS FOR LOCATING GROUND FAULTS AND INSULATION DEGRADATION CONDITION IN ENERGY CONVERSION SYSTEMS

STATEMENT REGARDING FEDERALLY SPONSORED RESEARCH OR DEVELOPMENT

This invention was made with U.S. government support under Contract No. DE-EE0000572 awarded by the Department of Energy (DOE). The U.S. government has certain rights in the invention.

BACKGROUND

The subject matter disclosed herein is related generally to energy conversion systems and specifically to methods of determining or locating ground faults and insulation degradation in energy conversion systems.

A photovoltaic (PV) cell converts light into direct current (DC) by exploiting the photovoltaic effect: when sunlight or some other light falls upon the cell surface, the electrons present in the valance band of the atoms of the cell material are being excited by the energy absorbed, and finally jump to the conduction band and become free. Then the free electrons may be attracted by a positively charged electrode thus generating a DC voltage. A PV system typically includes a plurality of PV cells connected in series/parallel to form a module, the modules are connected in series to form a string, and the strings are connected in parallel to form a DC distribution network.

Ground faults are a major hazard in energy conversion systems that include DC distribution networks, such as, for example, photovoltaic (PV) systems. Prompt detection and location of ground faults will provide higher system availability as well as a better protection for personnel and equipment.

BRIEF DESCRIPTION

In one embodiment, a method of detecting a ground fault within an energy conversion system is described. The energy conversion system includes a plurality of DC current carrying conductors. The method is performed using one or more processors. The method includes, for instance, obtaining a baseline frequency spectra of differential current for the plurality of the DC current carrying conductors for a healthy DC network within the energy conversion system; measuring differential current from the plurality of the DC current carrying conductors during operation; analyzing frequency spectra of the measured differential current from the plurality of the DC current carrying conductors during operation; comparing, by a processor, the baseline frequency spectra of current to the frequency spectra of the measured differential current during operation; and determining whether insulation degradation exists within said energy conversion system, the determining being based, in part, on the comparing of the baseline frequency spectra to the frequency spectra of the measured differential current during operation.

In another embodiment, a method of detecting insulation degradation within an energy conversion system is described. The energy conversion system includes a plurality of DC current carrying conductors. The method is performed using one or more processors. The method includes, for instance, obtaining a baseline frequency spectra of differential current at start-up for the plurality of the DC current carrying conductors for a healthy DC network within the energy conversion system; measuring differential current transient at start-up from the plurality of the DC current carrying conductors; analyzing frequency spectra of the measured differential current transient at start-up from the plurality of the DC current carrying conductors; comparing, by a processor, the baseline frequency spectra of current to the frequency spectra of the measured differential current transient at start-up; and determining whether insulation degradation exists within said energy conversion system, the determining being based, in part, on the comparing of the baseline frequency spectra to the frequency spectra of the measured differential current transient at start-up.

DRAWINGS

The features described herein may be better understood with reference to the drawings described below. The drawings are not necessarily to scale, emphasis is instead generally being placed upon illustrating the principles of the invention. In the drawings, like numerals are used to indicate like parts throughout the various views.

FIG. 1 schematically illustrates a layout of an energy conversion system described herein.

Figure 2:
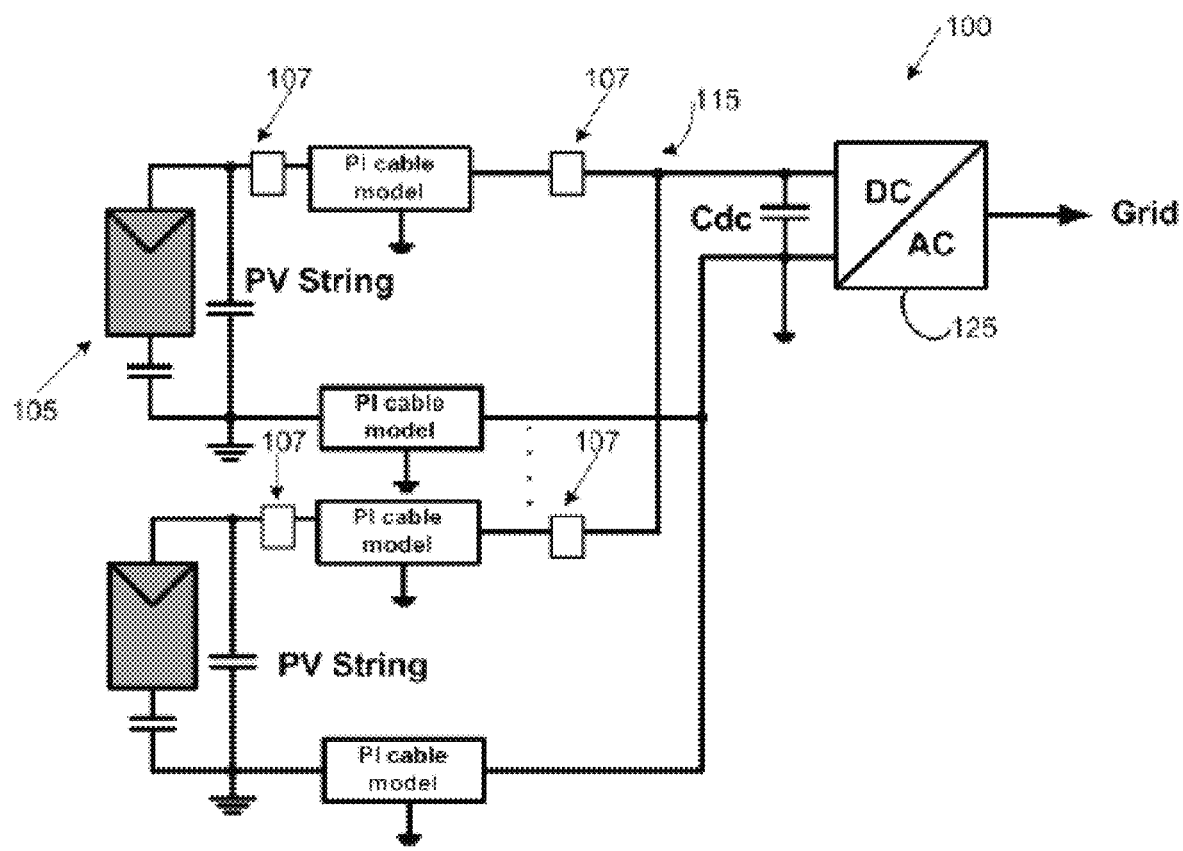

FIG. 2 schematically illustrates an equivalent electrical scheme of the energy conversion system 100 of FIG. 1.

Figure 3:
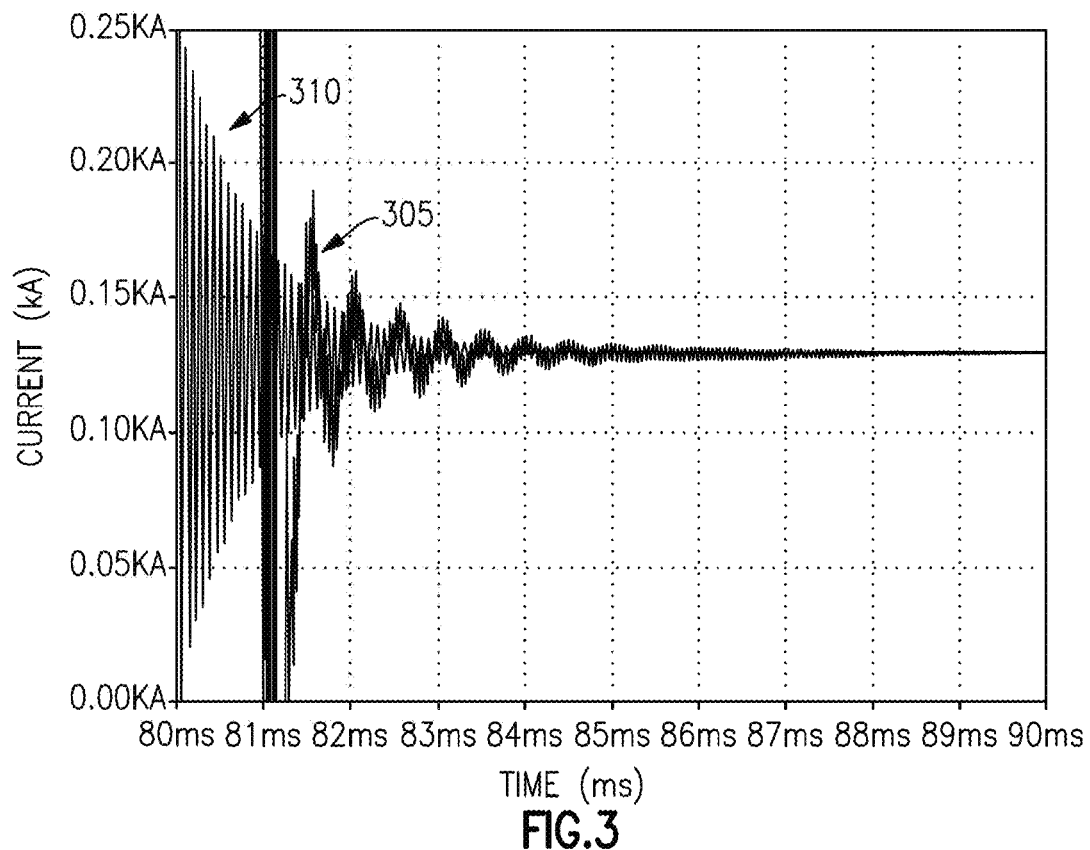

FIG. 3 schematically illustrates examples of time domain current waveforms measured in a healthy string and a faulty string of an energy conversion system described herein.

Figure 4:
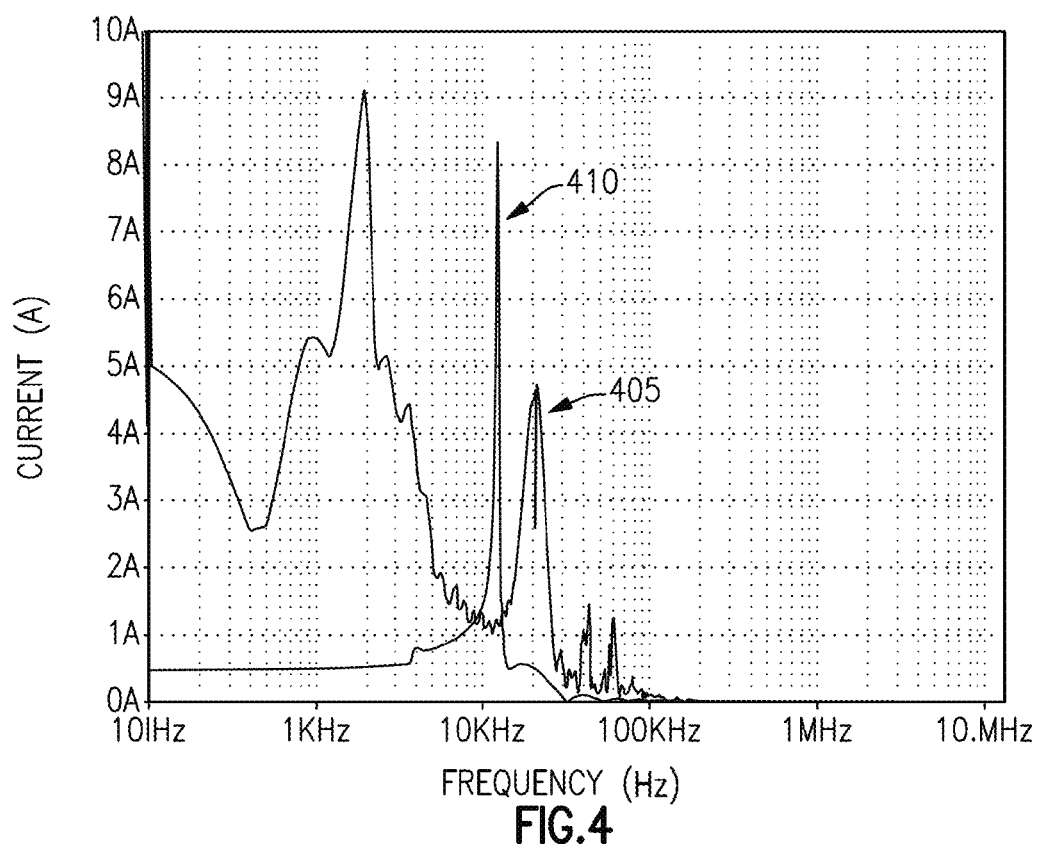

FIG. 4 schematically illustrates example frequency spectra of current waveforms measured in a healthy string and a faulty string of an energy conversion system described herein.

Figure 5:
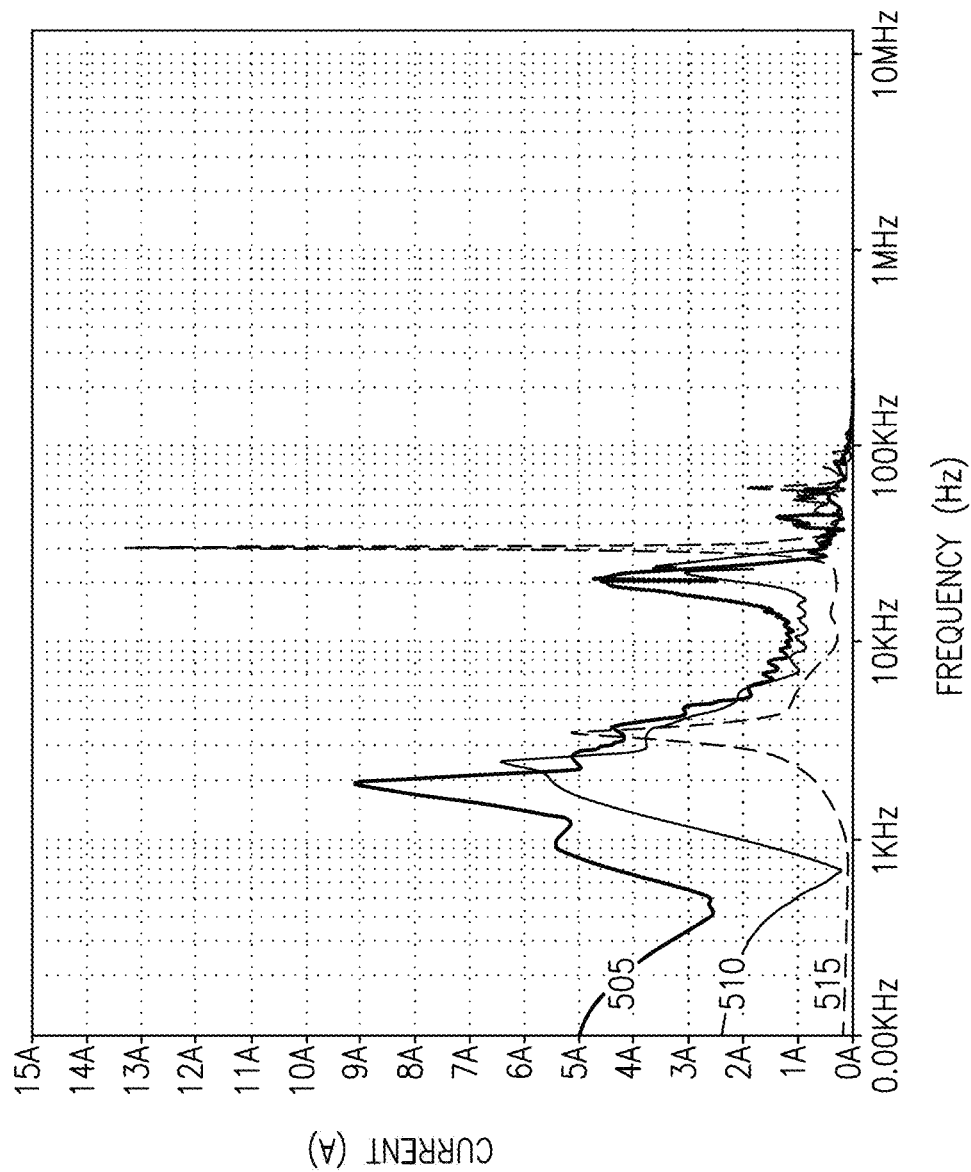

FIG. 5 schematically illustrates the variation in harmonic spectrum of the line current with the different fault locations.

FIGS. 6-11 schematically illustrate examples of different levels of insulation degradation and different locations of insulation degradation within a conductor.

Figure 12:
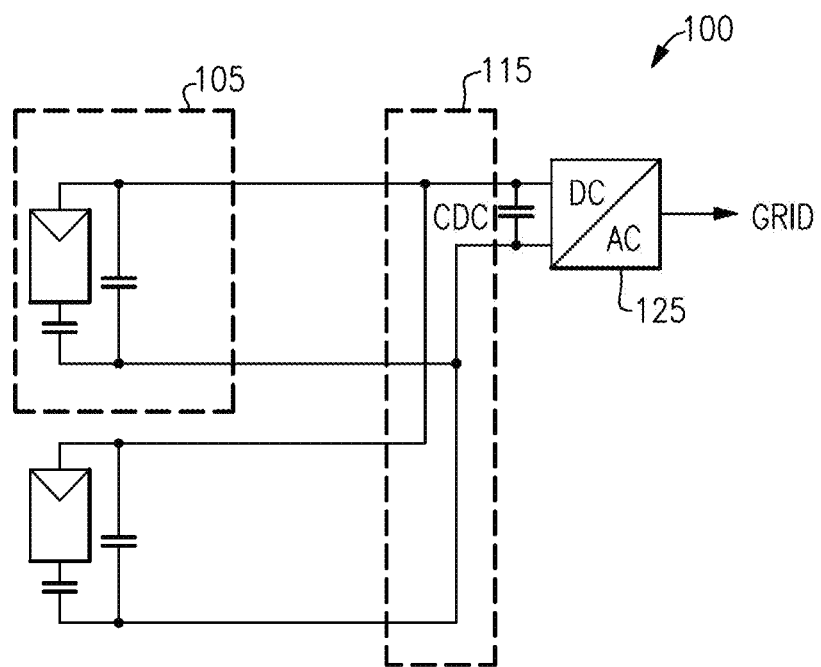

FIG. 12 schematically illustrates a layout of an energy conversion system with floating strings and floating inverter.

Figure 13:
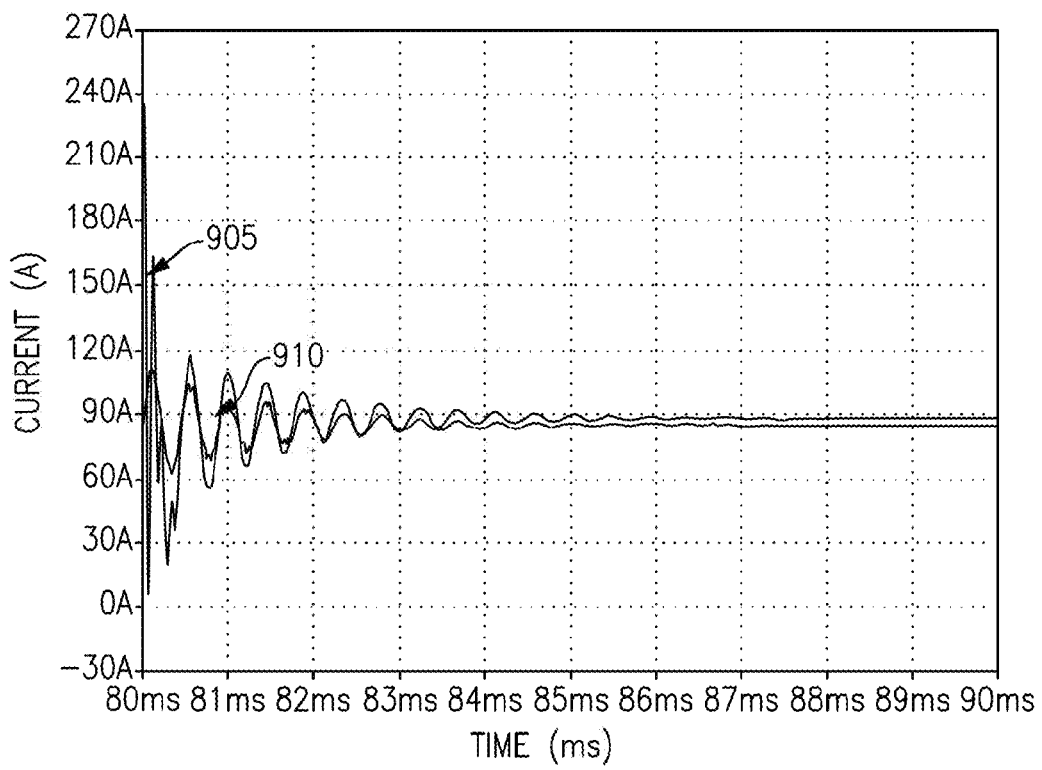
Figure 14:
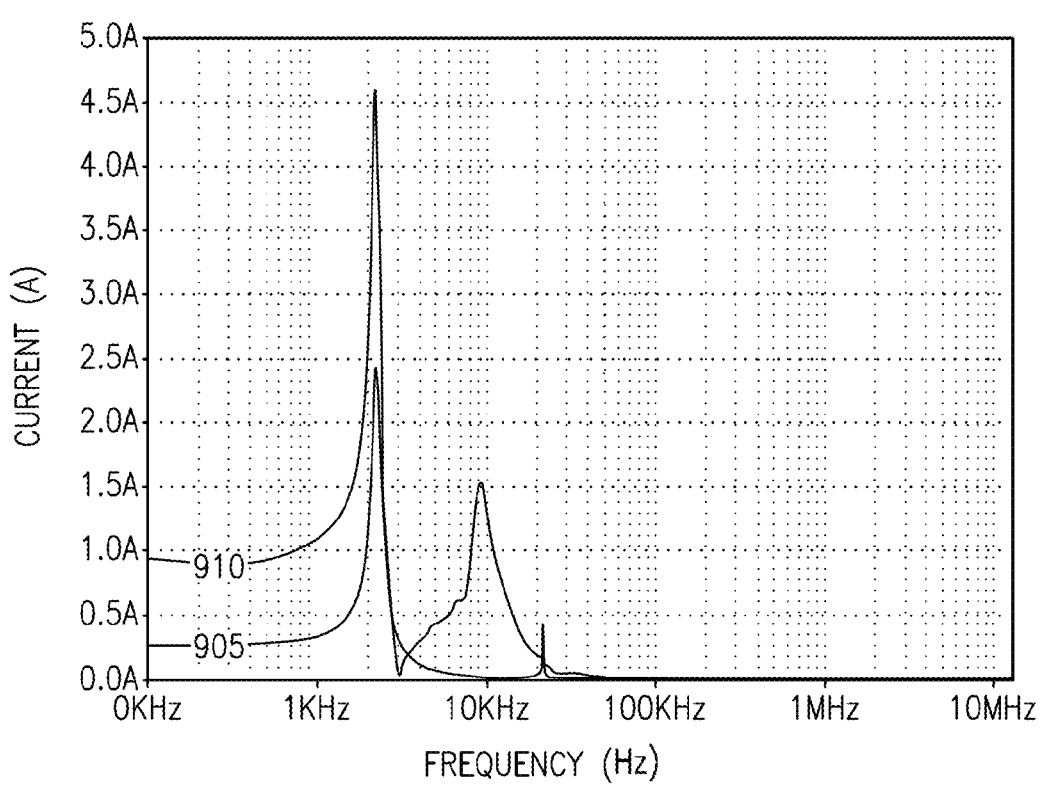

FIGS. 13-14 schematically illustrate examples of the time response and frequency spectrum of current in a faulty conductor line and a healthy conductor line.

Figure 15:
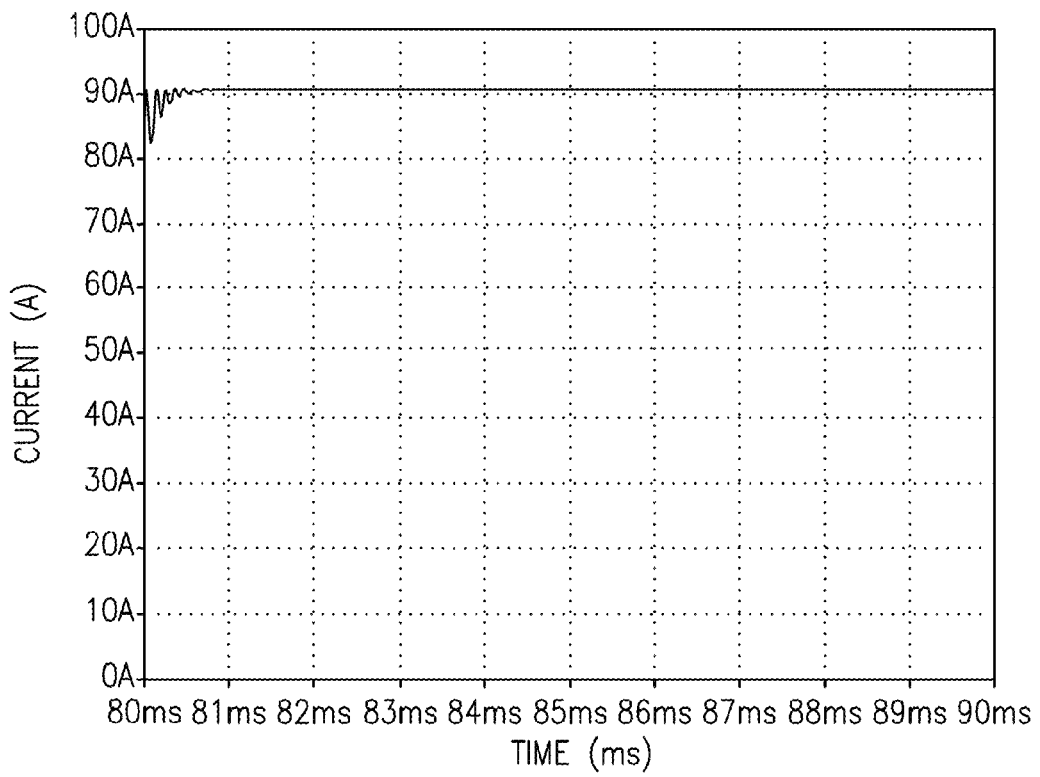
Figure 16:
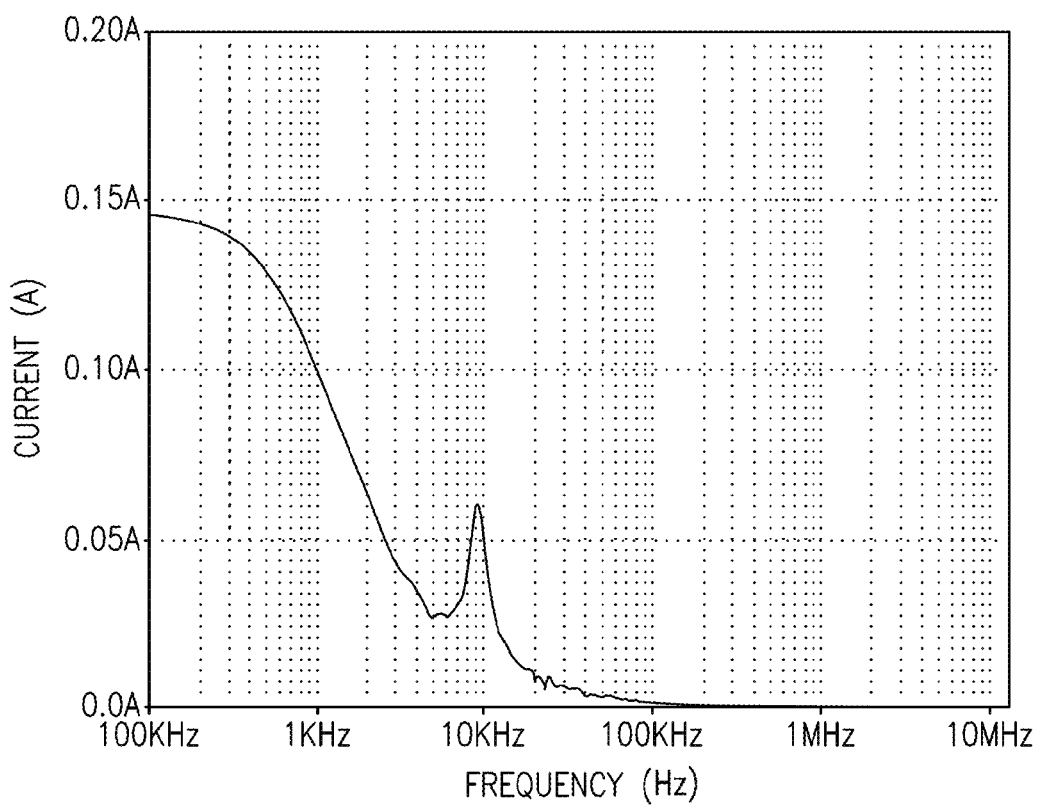

FIGS. 15-16 schematically illustrate example of the time response and frequency spectrum of current due to an irradiance step change.

Figure 17:
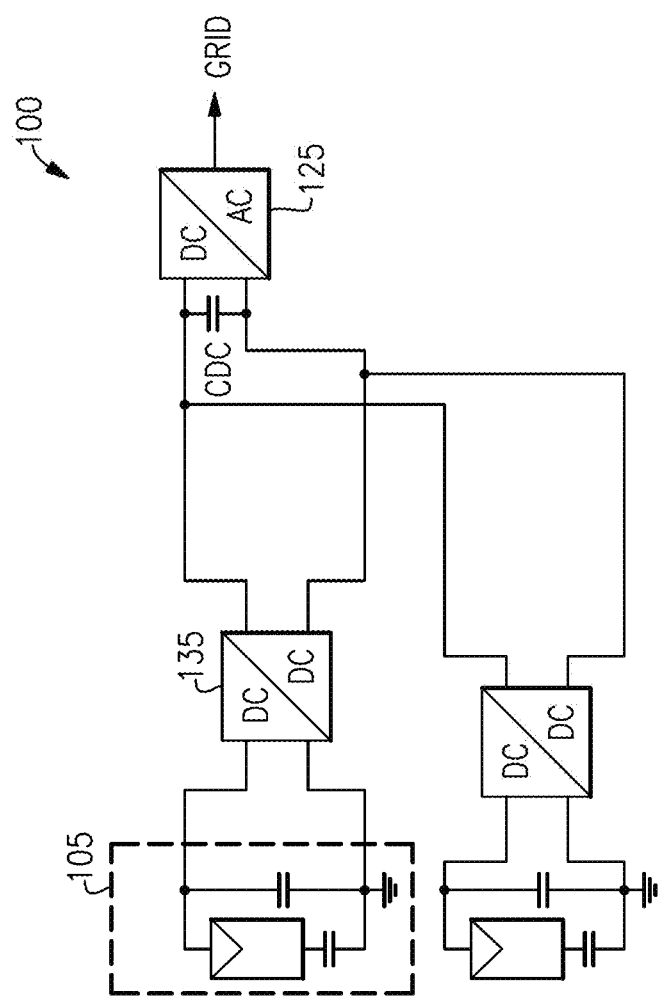

FIG. 17 schematically illustrates a layout of an energy conversion system with DC/DC converters.

Figure 18:
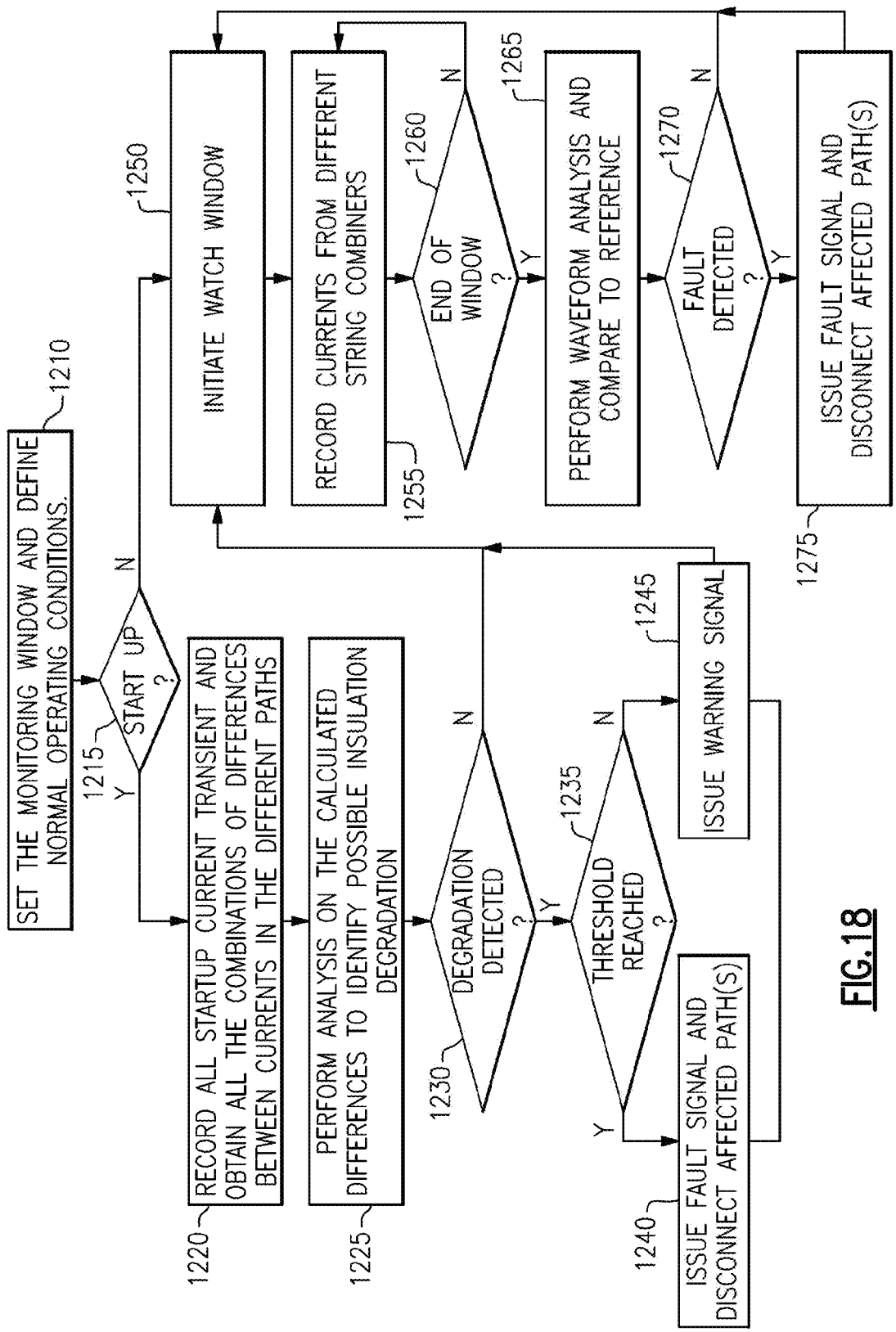

FIG. 18 schematically illustrates a flowchart of one illustrative embodiment of a method of locating ground faults and/or insulation degradation conditions within an energy conversion system.

DETAILED DESCRIPTION

Energy conversion systems, such as, for example, PV systems, may include multiple energy conversion modules (such as, for example, PV modules) which may be connected in series and/or in parallel thus creating a DC distribution network. Since the DC distribution network can be represented in terms of equivalent resistance (R), inductance (L) and capacitance (C), a ground fault or insulation degradation may change the equivalent alternating current (AC) impedance of the distribution network, therefore, by measuring currents at defined points of the distribution network, a location of the fault or even the beginning of insulation degradation may be detected and located through the analysis of the transient current waveforms and/or current frequency spectra.

One embodiment, of an energy conversion system 100 is schematically illustrated by FIG. 1. The energy conversion system 100 may include one or more strings 105 of series connected energy conversion PV modules 110. In certain embodiments, each energy conversion module 110 may include one or more PV cells converting light into DC by using the photovoltaic effect.

The energy conversion system 100 may include one or more string combiners 115. Each string combiner may receive DC feeds from two or more strings 105 and aggregate the multiple DC feeds into an output feeder conductor 120. In certain embodiments, a string combiner may include one or more electrical switches. Each electrical switch may be configured to selectively connect or disconnect at least one DC current carrying conductor to or from the output feeder conductor 120.

In certain embodiments, the conductor 120 may transmit the aggregated DC to a DC/AC inverter 125. Alternatively, the conductor 120 may transmit the aggregated DC to a downstream array combiner 130, so that the combiners may be arranged in a hierarchical structure including energy conversion modules 110 feeding DC into first-level combiners 115, groups of first level combiners 115 feeding DC into downstream combiners 130, and the latter feeding DC into a DC/AC inverter 125.

An equivalent electrical schematic of the above described embodiment of the energy conversion system 100 is illustrated by FIG. 2.

A ground fault may occur within a string 105. "Ground fault" herein shall mean an accidental electrical short circuit between the ground and one or more current carrying conductors. A ground fault within a current carrying conductor may be detected and located by measuring the values of DC network transient current within the energy conversion system 100 and analyzing the time domain waveforms and/or frequency spectra.

In certain embodiments, a current sensor 107 may be placed at each string 105 for measuring the differential current within the strings as shown in, for example, FIG. 1. In other embodiments, a plurality of current sensor 107 may be installed at a string combiner level, as illustrated, for example, in FIG. 2, to measure the differential currents within each string feeding the combiner. In this embodiment, a current sensor 107 may be placed before or after a cable, modeled, in one example, as ten cascaded RLC pi-networks. It is not necessary to have sensors on both ends. FIG. 2 merely illustrates two examples of the placement of a current sensor 107 in relation to the PI cable. The current sensors can be connected such that there is a current sensor for each PV string feeding the combiner, or a current sensor per string combiner that measures the total current coming out of that string combiner. Yet, in other embodiments, one or more time domain current waveforms can be derived from the current sensors' output values. Alternatively, one or more current frequency spectra can be derived from by the current sensors' output values. With a current sensor placed at each string or string combiner, the differential current measurement can be sent to, for example, a central monitoring or control unit that could analyze the harmonic components of the waveforms to detect and locate the faulted line.

FIG. 3 schematically illustrates one example of time domain current waveforms measured in a healthy string (waveform 305) and a faulty string (waveform 310). FIG. 4 schematically illustrates an example of the frequency spectra of current waveforms measured in a healthy string (waveform 405) and a faulty string (waveform 410). Hence, by comparing one or more values of current or one or more current frequency spectra for a given string to a reference or baseline dataset, it is possible to diagnose a ground fault within the string, e.g., based on different numbers and/or positions of peaks in the time domain current waveforms and/or current frequency spectra. In certain embodiments, the reference or baseline dataset may be provided by storing it in the system's memory historical measurements data for a plurality of strings, and selecting the historical dataset corresponding to a string which is currently being diagnosed. Alternatively, the reference dataset may be obtained by computer-based simulation of values of current and/or current frequency spectra for a healthy string.

One or more current frequency spectra may be used to locate the position of a fault within the conductive line. In one illustrative example, schematically shown in FIG. 5, a fault occurring at 20% (waveform 505), 50% (waveform 510) and 90% (waveform 515) of the conductor length (measured, e.g., conductor starting at the PV module side and ending at the DC/AC inverter) may be identified by analyzing the current harmonic spectra measured at the string combiner.

Figure 6:
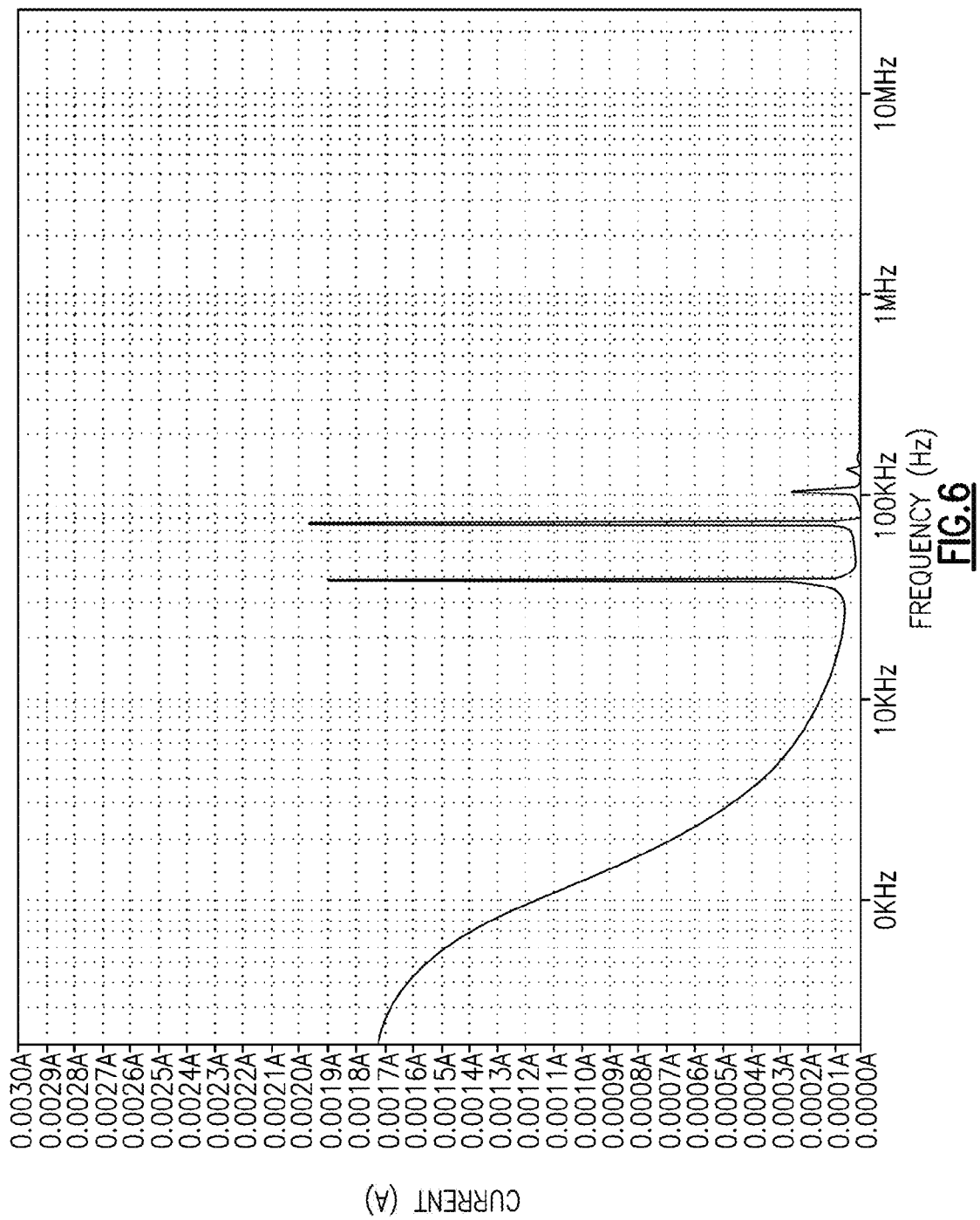
Figure 7:
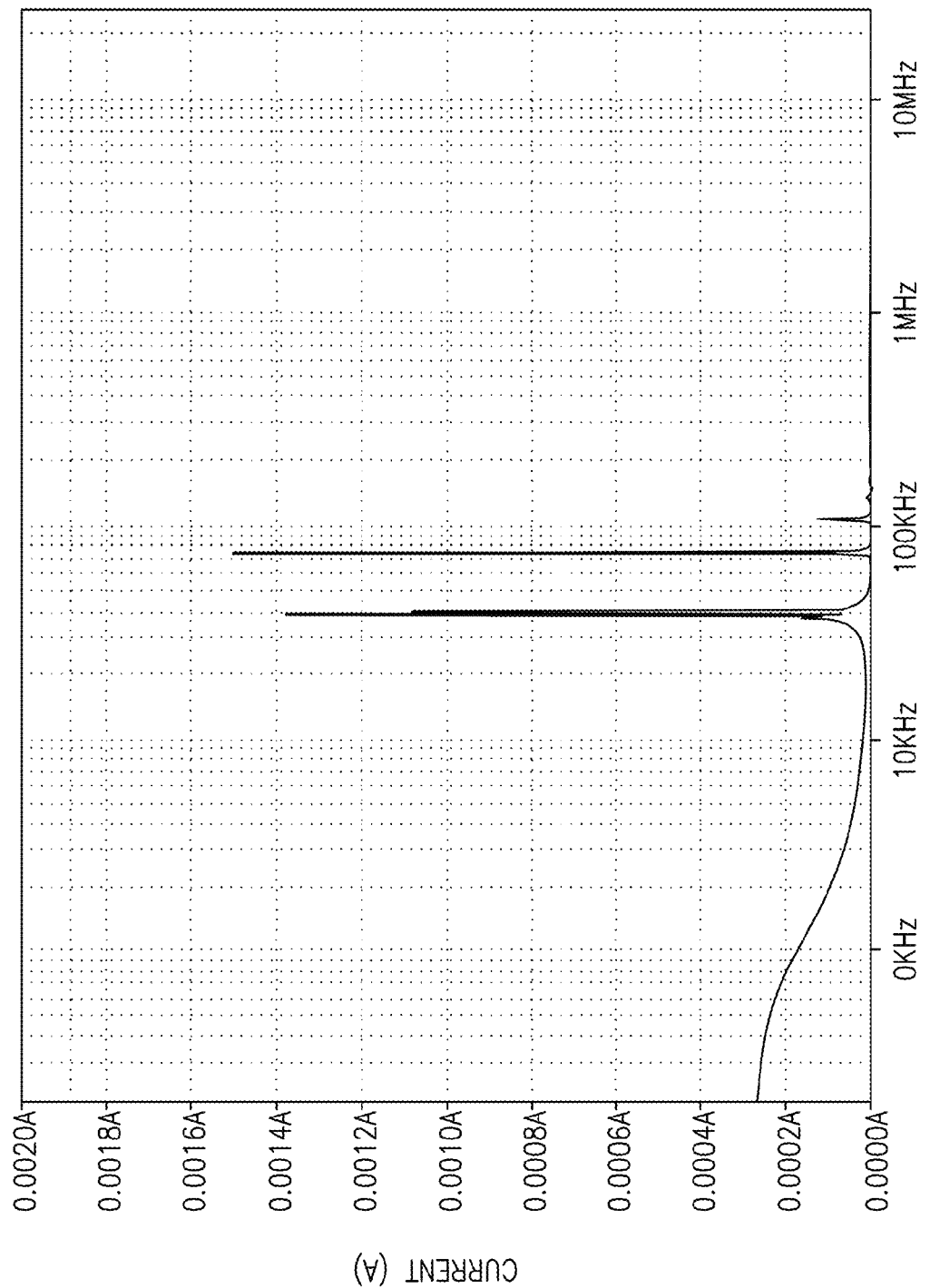
Figure 8:
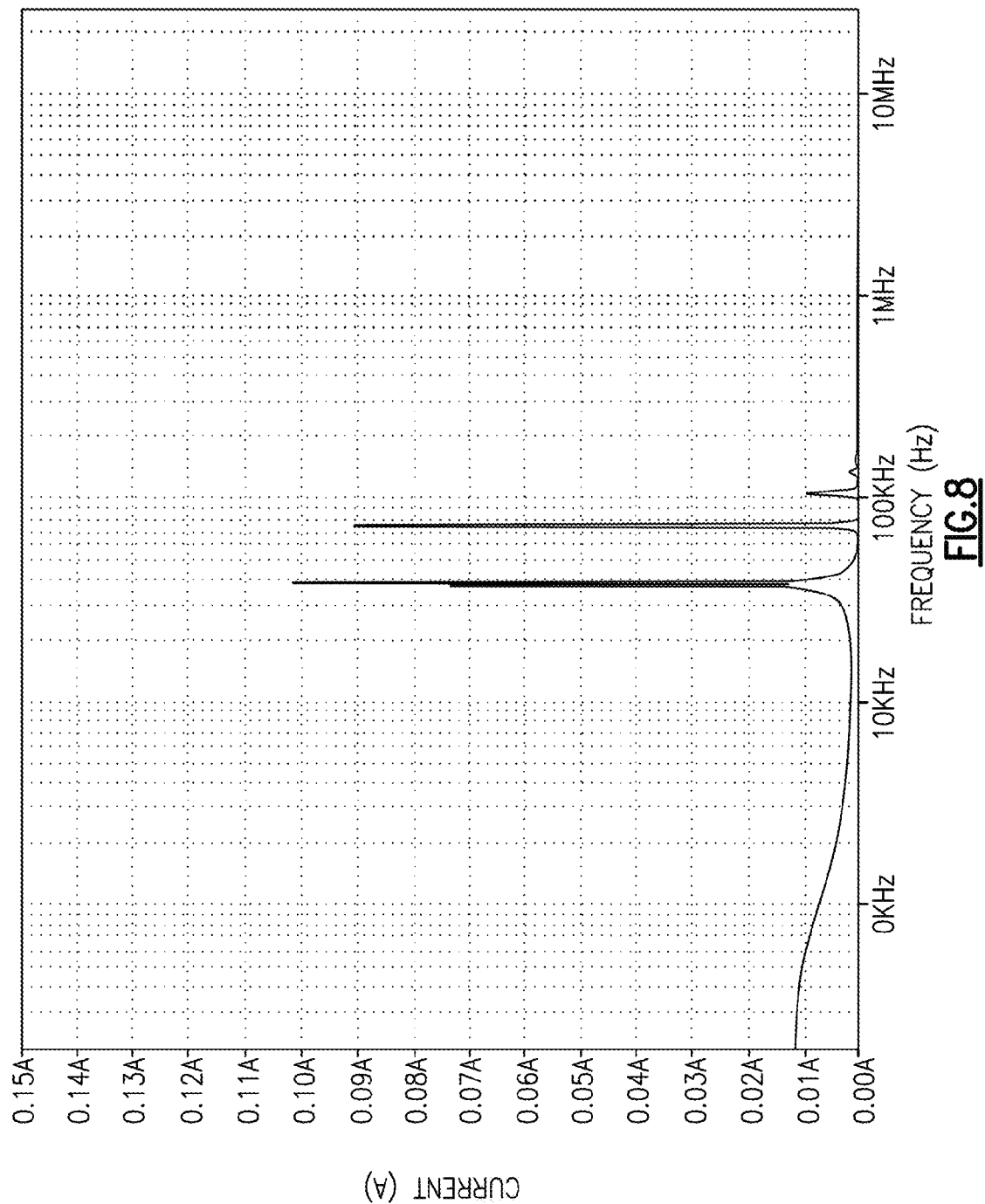
Figure 9:
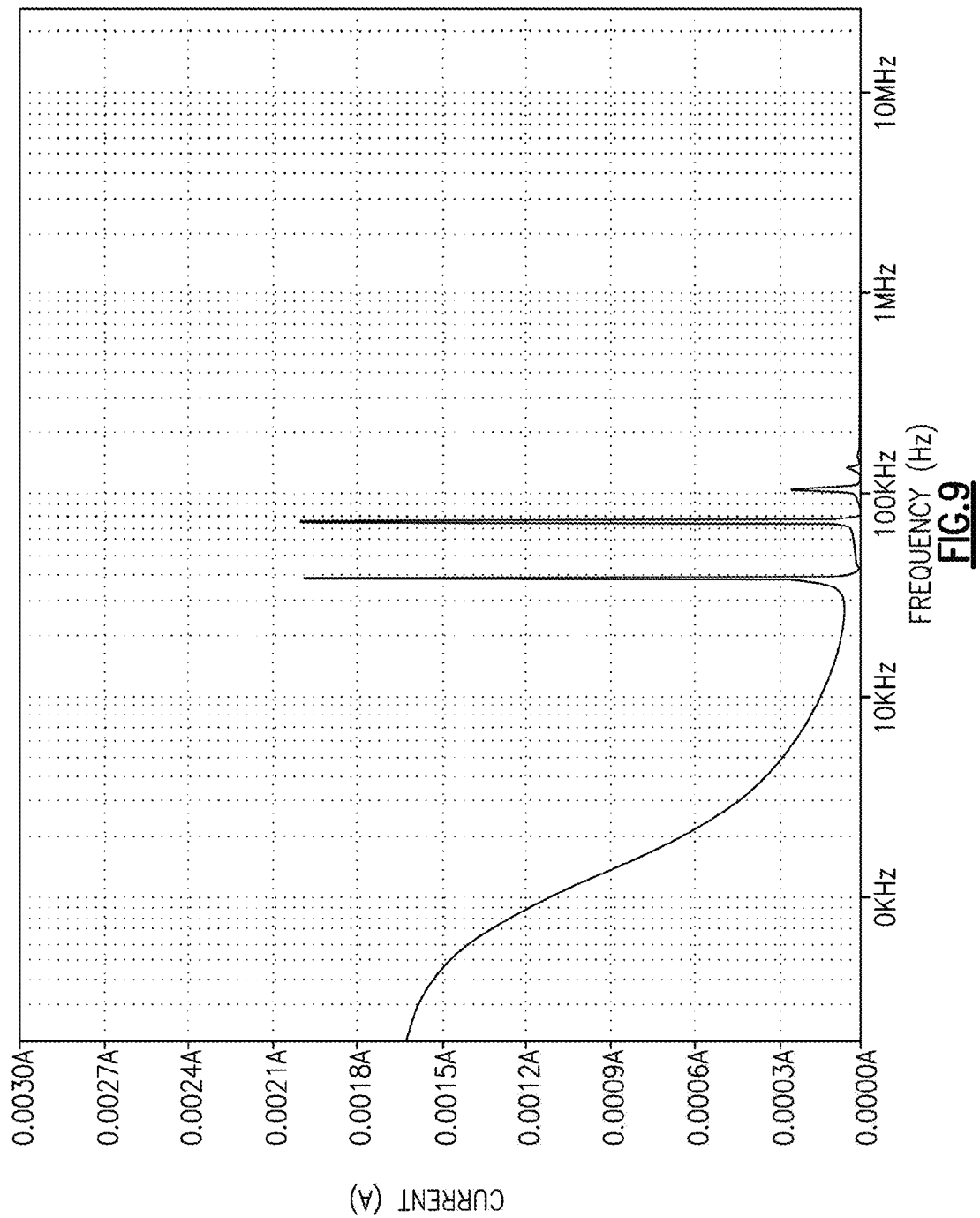
Figure 10:
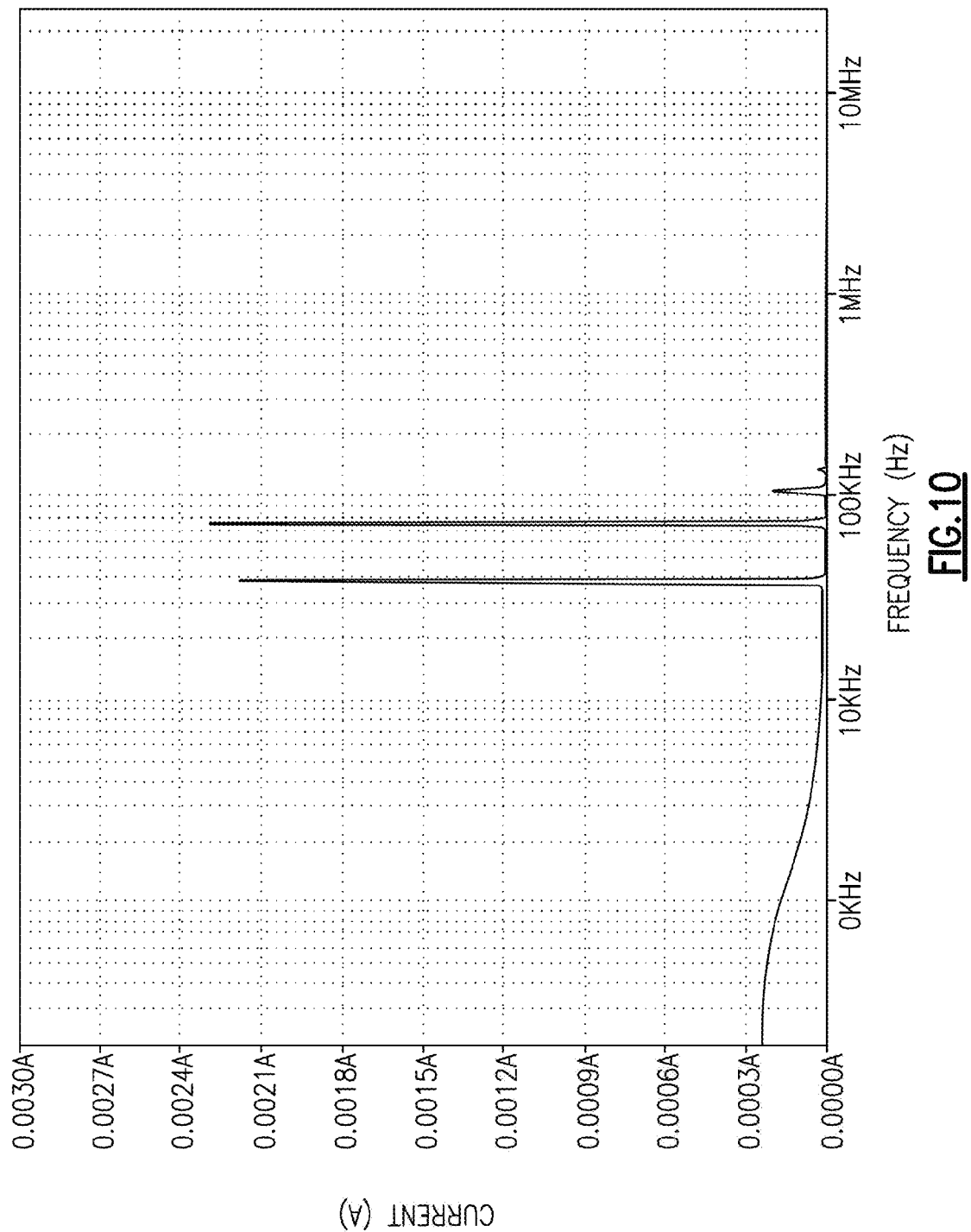
Figure 11:
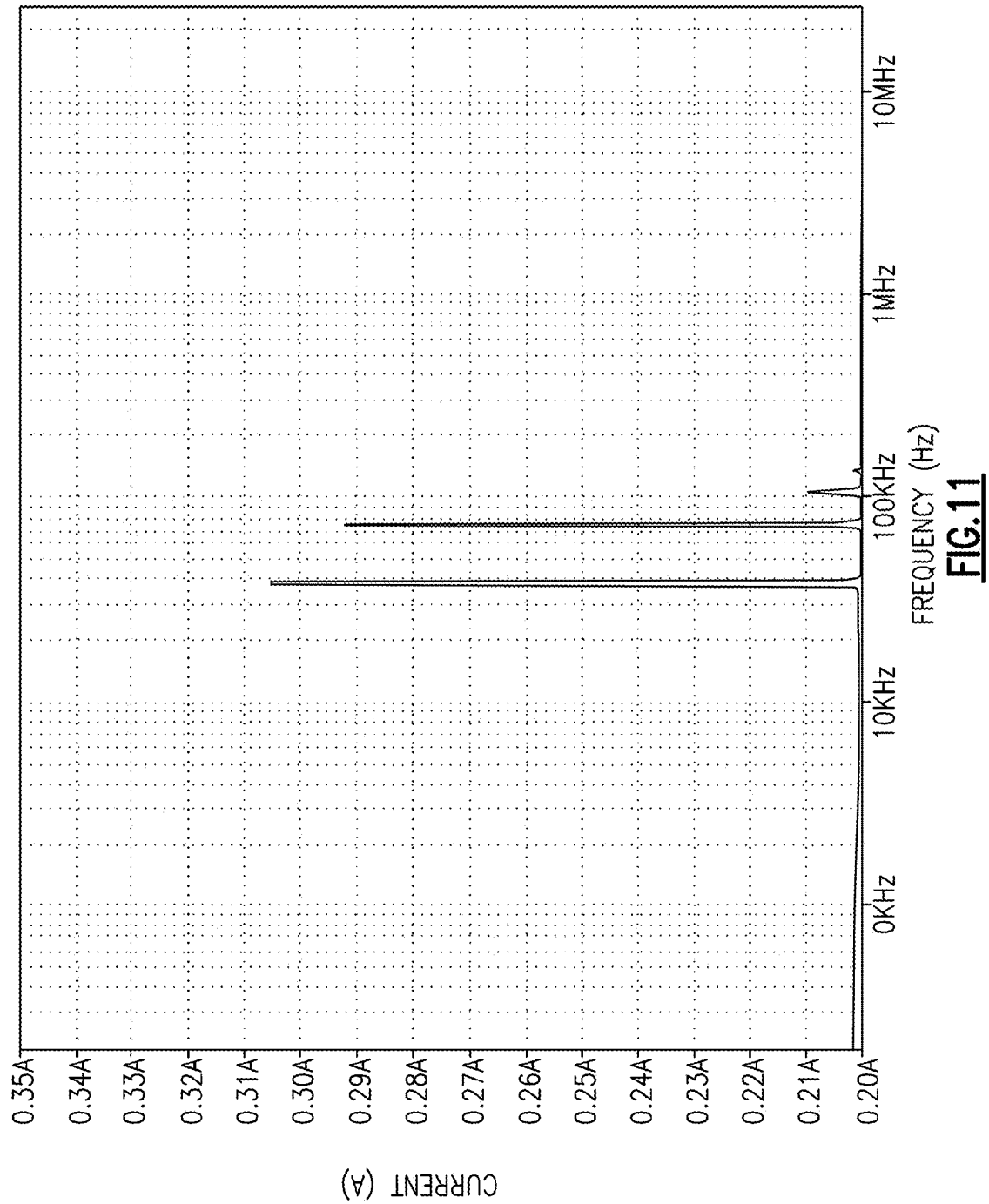

By measuring the values of the current within the energy conversion system 100 and analyzing the current waveforms and/or current frequency spectra, the insulation degradation conditions within DC current carrying conductors may be detected. Since the insulation degradation is substantially a steady state condition rather than a sharp transient condition, it may be detected by comparing the measurements of the current from healthy and degraded lines during the startup phase (i.e., when current is initiated through a DC current carrying conductor). A conductor having a degraded insulation may be determined and the insulation degradation condition may be located within the conductor by comparing the currents from different conductors. FIGS. 6-8 schematically illustrate one example of insulation impedance degradation at 20% of the length of a current carrying conductor to 100 kΩ, 10 kΩ, and 1 kΩ, respectively. FIGS. 9-11 schematically illustrate one example of insulation impedance degradation at 80% of the length of a current carrying conductor to 100 kΩ, 10 kΩ, and 1 kΩ, respectively.

Various conductive parts of the energy conversion system 100 which are not current-carrying may be grounded. For example, in the illustrative embodiment of FIG. 2, one or more strings 105 of series connected energy conversion modules 110 are grounded, and the DC/AC inverter 125 is grounded. In another illustrative embodiment, schematically shown in FIG. 12, strings 105 and inverter 125 may be floating. In case of floating strings and floating inverter, locating a ground fault becomes more complicated as a first fault does not provide a DC path, and known methods rely on the occurrence of a second fault to diagnose a ground fault condition. The inventors discovered that by analyzing current waveforms and/or current frequency spectra, the first occurrence of the ground fault may be detected, thus avoiding the damage which might have been caused by subsequent faults.

Harmonic frequencies caused by a ground fault are distinctively different from the transient current caused by a step change in the DC-side current, as schematically illustrated by FIGS. 13-16. FIG. 13 schematically illustrates one example of the time response of current in a faulty line 905 and a healthy line 910. Since the detection method relies on the analysis of the transient current response in the DC network, it is essential to verify that a transient response due to a step change in the input PV current resulting from a step change in irradiance, does not result in a similar response like that of a fault or insulation degradation condition. FIG. 14 schematically illustrates one example of frequency spectra of current in a faulty line 905 and a healthy line 910. FIG. 15 schematically illustrates one example of the time response of current due to an irradiance step change. FIG. 16 schematically illustrates one example of the frequency spectrum of current due to an irradiance step change.

In another embodiment, the energy conversion system may include one or more DC/DC converters 135 connected in parallel with one or more strings 105, as shown by FIG. 17. In the illustrative embodiment of FIG. 17, current sensors employed for monitoring the DC/DC converter performance may also be used to monitor the state of the DC network and diagnose ground faults within the strings 105.

In a further aspect shown in FIG. 1, the energy conversion system 100 may further include a controller 150. In certain embodiments, the controller 150 may be configured to determine, by comparing values of current received from one or more current sensors to the reference data stored in the memory accessible by the controller 150, a DC current carrying conductor within which a ground fault condition has occurred. In certain embodiments, the controller 150 may be configured to process values of current received from one or more current sensors to derive one or more current frequency spectra. The controller 150 may be further configured to determine, by comparing the current frequency spectra to the reference data stored in the memory accessible by the controller 150, a DC current carrying conductor within which a ground fault condition has occurred.

In another embodiment, the controller 150 may be configured to determine, by comparing values of current received from one or more current sensors to the reference data stored in the memory accessible by the controller 150, a DC current carrying conductor within which an isolation degradation condition has occurred. In certain embodiments, the controller 150 may be configured to process values of current received from one or more current sensors to derive one or more current frequency spectra. The controller 150 may be further configured to determine, by comparing the current frequency spectra to the reference data stored in the memory accessible by the controller 150, a DC carrying conductor within which an isolation degradation condition has occurred.

The controller 150 may be coupled to the plurality of current sensors 107 via one or more wired or wireless links.

The controller 150 may include one or more processors coupled to a memory. The memory may be provided by a volatile (e.g., RAM) or non-volatile (e.g., EPROM) memory. The controller 150 may further include one or more communication interfaces. In certain embodiments, the controller 150 may further include a graphical user interface, provided, e.g., by a display and a keyboard.

Another method of locating ground faults and/or insulation degradation conditions within an energy conversion system is presented. FIG. 18 schematically illustrates a flowchart of one embodiment of the method.

At step 1210, the duration of the monitoring window during which the measurement of currents are analyzed is chosen. The duration of the monitoring window is chosen as a function of the system dominant frequencies, which in turn may be dependent upon the performance characteristics of the energy conversion modules and type, and the cross-section and length of the cables employed within the system. In certain embodiments, the dominant frequencies may be determined by computer-based simulation.

At step 1215, if the system is in the startup mode, the processing may continue to step 1220; otherwise, the method may branch to step 1250. Since insulation degradation is more of a steady state condition rather than a sharp transient, it can be detected by, for example, comparison of current from healthy and degraded lines during startup transient. Even if the starting current in different strings are significantly different, insulation degradation in a certain zone or cable of the DC network can be located by, for example, calculating the differences in current from different string combiners.

At step 1220, all startup current transient and/or current frequency spectra are measured and recorded, and all the combinations of differences between currents in the different paths from different strings or string combiners is obtained, and may be stored in memory.

At step 1225, combinations of differences between currents and/or current frequency spectra in different paths are analyzed by, for example, analyzing the harmonic components of the measured differential current, as opposed to the common mode current normally used for ground fault detection, from different strings or string combiners and comparing this current spectrum to that of a baseline or reference spectrum of a healthy DC network, to identify a DC current conductor within which an insulation degradation condition has occurred. Current analysis may be performed by, for example, spectral analysis (Fast Fourier Transform) or any other analysis or classification method such as wavelet analysis, neural networks or fuzzy logic.

At step 1230, if an insulation degradation condition has been detected, the processing may continue to step 1235. Otherwise, the method may branch to step 1250.

At step 1235, if a threshold level has been reached, the processing will continue to step 1240; otherwise, the method may branch to step 1245. The method seeks to identify current components at particular frequency bands. The current threshold levels that trigger protective action are primarily dependent on the network layout.

At step 1240, a fault signal is issued and/or affected path(s) are disconnected. The processing continues to step 1250.

At step 1245, a warning signal is issued.

At step 1250, a current monitoring window is initiated.

At step 1255, measured currents and/or current frequency spectra from different string combiners are stored in memory.

At step 1260, if the monitoring window duration has elapsed, the processing continues to step 1265; otherwise, the method loops back to step 1255.

At step 1265, waveform analysis is performed, and the measured data is compared to reference data stored in memory. In certain embodiments, the reference data is provided by storing in the system's memory historical measurements data for a plurality of strings, and selecting the historical dataset corresponding to a string which is currently being diagnosed. Alternatively, the reference dataset is obtained by computer-based simulation of measurements of current and/or current frequency spectra for a healthy string.

At step 1270, if a ground fault is detected, the processing continues to step 1275; otherwise, the method loops back to step 1250.

At step 1275, a fault signal is issued and/or affected path(s) are disconnected. The method loops back to step 1250.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. For example, transient current analysis using fast Fourier transform may be used to detect and locate the faults. However, other methods such as wavelet analysis, neural network or fuzzy logic classifiers can be used to analyze the transient current waveforms and locate the faults and degradation conditions. While the dimensions and types of materials described herein are intended to define the parameters of the various embodiments, they are by no means limiting and are merely exemplary. Many other embodiments will be apparent to those skilled in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure. It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the invention has been described in detail in connection with only a limited number of embodiments, it should be readily understood that the invention is not limited to such disclosed embodiments. Rather, the invention may be modified to incorporate any number of variations, alterations, substitutions or equivalent arrangements not heretofore described, but which are commensurate with the spirit and scope of the invention. Additionally, while various embodiments of the invention have been described, it is to be understood that aspects of the disclosure may include only some of the described embodiments. Accordingly, the invention is not to be seen as limited by the foregoing description, but is only limited by the scope of the appended claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A method of detecting a ground fault within an energy conversion system, said energy conversion system including a plurality of DC current carrying conductors, said method performed using one or more processors, said method comprising:
    obtaining a baseline frequency spectra of differential current for the plurality of DC carrying conductors for a healthy DC network within said energy conversion system;
    measuring differential current from the plurality of the DC current carrying conductors during operation;
    analyzing frequency spectra of the measured differential current from the plurality of DC current carrying conductors during operation;
    comparing, by a processor, the baseline frequency spectra of current to the frequency spectra of the measured current during operation; and
    determining whether a ground fault exists within said energy conversion system, the determining being based, in part, on the comparing of the baseline frequency spectra of differential current to the frequency spectra of measured differential current during operation.

2. The method of claim 1, wherein the energy conversion system is grounded.

3. The method of claim 1, wherein the energy conversion system is floating.

4. The method of claim 1, further comprising determining the location of the ground fault by comparing the baseline frequency spectra of current to the frequency spectra of the measured current during operation.

5. The method of claim 1, further comprising storing the reference waveform of current.

6. The method of claim 1, wherein the analyzing the frequency spectra of the measured differential current from the plurality of the DC current carrying conductors during operation is performed using spectral analysis, wavelet analysis, neural networks or fuzzy logic.

7. The method of claim 1, wherein the energy conversion system is a photovoltaic system.

8. The method of claim 7, wherein the differential current is measured from different strings of energy conversion modules of the photovoltaic system.

9. The method of claim 7, wherein the differential current is measured from string combiners of the photovoltaic system.

10. A method of detecting insulation degradation within an energy conversion system, said energy conversion system including a plurality of DC current carrying conductors, said method performed using one or more processors, said method comprising:
    obtaining a baseline frequency spectra of differential current at startup for the plurality of the DC current carrying conductors for a healthy DC network within said energy conversion system;
    measuring differential current transient at start-up from the plurality of the DC current carrying conductors;
    analyzing frequency spectra of the measured differential current transient at start-up from the plurality of the DC current carrying conductors;
    comparing, by a processor, the baseline frequency spectra of current to the frequency spectra of the measured differential current transient at start-up; and
    determining whether insulation degradation exists within said energy conversion system, the determining being based, in part, on the comparing of the baseline frequency spectra to the frequency spectra of the measured differential current transient at start-up.

11. The method of claim 10, wherein the energy conversion system is grounded.

12. The method of claim 10, wherein the energy conversion system is floating.

13. The method of claim 10, further comprising determining the location of the insulation degradation by comparing the baseline frequency spectra of differential current to the existing frequency spectra of differential current transient at start-up.

14. The method of claim 10, further comprising storing the baseline frequency spectra of current.

15. The method of claim 10, wherein the analyzing the frequency spectra of the measured differential current from the plurality of the DC current carrying conductors during operation is performed using spectral analysis, wavelet analysis, neural networks or fuzzy logic.

16. The method of claim 10, wherein the energy conversion system is a photovoltaic system.

17. The method of claim 16, wherein the differential current is measured from different strings of energy conversion modules of the photovoltaic system.

18. The method of claim 16, wherein the differential current is measured from string combiners of the photovoltaic system.

* * * * *